(12) United States Patent
Smith et al.

(10) Patent No.: US 7,135,350 B1
(45) Date of Patent: *Nov. 14, 2006

(54) USE OF DOPED SILICON DIOXIDE IN THE FABRICATION OF SOLAR CELLS

(75) Inventors: David D. Smith, San Jose, CA (US); Michael J. Cudzinovic, Sunnyvale, CA (US); Keith R. McIntosh, Newport (AU); Bharatkumar Gamanlal Mehta, Austin, TX (US)

(73) Assignee: Sunpower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/328,419

(22) Filed: Jan. 9, 2006

Related U.S. Application Data

(63) Continuation of application No. 10/946,564, filed on Sep. 21, 2004, now Pat. No. 6,998,288.

(60) Provisional application No. 60/508,772, filed on Oct. 3, 2003.

(51) Int. Cl.
*H01L 21/00* (2006.01)

(52) U.S. Cl. .......................... 438/48; 438/57; 438/73; 136/243; 136/249; 136/252; 257/E27.124

(58) Field of Classification Search ................ 438/48, 438/57, 73; 136/243; 257/E27.124
See application file for complete search history.

(56) References Cited

U.S. PATENT DOCUMENTS

| 5,217,539 A | * | 6/1993 | Fraas et al. | ................ 136/246 |
| 2004/0200520 A1 | * | 10/2004 | Mulligan et al. | ........... 136/256 |

* cited by examiner

*Primary Examiner*—Michelle Estrada
*Assistant Examiner*—Nicholas J. Tobergte
(74) *Attorney, Agent, or Firm*—Okamoto & Benedicto LLP

(57) ABSTRACT

In one embodiment, a method of forming doped regions in a substrate of a back side contact solar cell includes the steps of depositing a first doped oxide layer on a back side of a substrate, depositing a first undoped oxide layer over the first doped oxide layer, diffusing a first dopant from the first doped oxide layer into the substrate to form a first doped region in the substrate, and diffusing a second dopant into the substrate by way of a front side of the substrate, wherein the diffusion of the first dopant and the second dopant into the substrate are performed in-situ. The method may further include the steps of patterning the first doped and undoped oxide layers to expose portions of the back side of the substrate and depositing a second doped and undoped oxide layers on the back side of the substrate.

12 Claims, 3 Drawing Sheets

USE OF DOPED SILICON DIOXIDE IN THE FABRICATION OF SOLAR CELLS

CROSS-REFERENCE TO RELATED APPLICATION

This application is a continuation of U.S. application Ser. No. 10/946,564, filed on Sep. 21, 2004, now U.S. Pat. No. 6,998,288 which claims the benefit of U.S. Provisional Application No. 60/508,772, entitled "Use Of Doped Silicon Dioxide In The Fabrication Of Solar Cells," filed by David D. Smith, Michael J. Cudzinovic, and Keith McIntosh on Oct. 3, 2003. The aforementioned disclosures are incorporated herein by reference in their entirety.

BACKGROUND OF THE INVENTION

1. Field of the Invention

The present invention relates generally to solar cells, and more particularly but not exclusively to methods and apparatus for fabricating solar cells.

2. Description of the Background Art

Solar cells are well known devices for converting solar radiation to electrical energy. They may be fabricated on a semiconductor wafer using semiconductor processing technology. Generally speaking, a solar cell may be fabricated by forming p-doped and n-doped regions in a silicon substrate. Solar radiation impinging on the solar cell creates electrons and holes that migrate to the p-doped and n-doped regions, thereby creating voltage differentials between the doped regions. In a back side contact solar cell, the doped regions are coupled to metal contacts on the back side of the solar cell to allow an external electrical circuit to be coupled to and be powered by the solar cell. Back side contact solar cells are also disclosed in U.S. Pat. Nos. 5,053,083 and 4,927,770, which are both incorporated herein by reference in their entirety.

Just like in most manufacturing processes, each step employed in the manufacture of solar cells has an associated cost. Thus, techniques for simplifying the fabrication of solar cells are generally desirable.

SUMMARY

In one embodiment, a method of forming doped regions in a substrate of a back side contact solar cell includes the steps of depositing a first doped oxide layer on a back side of a substrate, depositing a first undoped oxide layer over the first doped oxide layer, diffusing a first dopant from the first doped oxide layer into the substrate to form a first doped region in the substrate, and diffusing a second dopant into the substrate by way of a front side of the substrate, wherein the diffusion of the first dopant and the second dopant into the substrate are performed in-situ. The method may further include the steps of patterning the first doped and undoped oxide layers to expose portions of the back side of the substrate and depositing a second doped and undoped oxide layers on the back side of the substrate.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present disclosure relates to the fabrication of solar cells. Solar cell fabrication processes are also disclosed in the following commonly-assigned disclosures, which are incorporated herein by reference in their entirety: U.S. application Ser. No. 10/412,638, entitled "Improved Solar Cell and Method of Manufacture," filed on Apr. 10, 2003 by William P. Mulligan, Michael J. Cudzinovic, Thomas Pass, David Smith, Neil Kaminar, Keith McIntosh, and Richard M. Swanson; and U.S. application Ser. No. 10/412,711, entitled "Metal Contact Structure For Solar Cell And Method Of Manufacture," filed on Apr. 10, 2003 by William P. Mulligan, Michael J. Cudzinovic, Thomas Pass, David Smith, and Richard M. Swanson.

FIGS. 1–7 schematically illustrate a method of fabricating a solar cell in accordance with an embodiment of the present invention.

Figure 1:
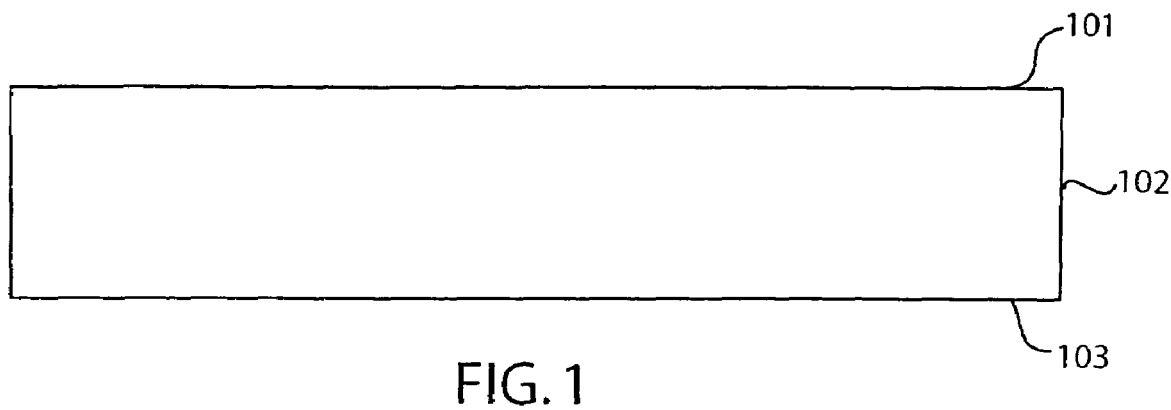
FIGS. 1–7 schematically illustrate a method of fabricating a solar cell in accordance with an embodiment of the present invention.

In FIG. 1, an N-type FZ silicon wafer 102 is processed to a thickness of about 280 µm. Wafer 102 serves as the substrate of the solar cell being fabricated. Wafer 102 has a front side 101 and a back side 103. Front side 101 is the side of the solar cell configured to receive solar radiation, and thus faces the sun in operation. Wafer 102 is thinned to a thickness of about 240 µm using a process that also etches damages from the surfaces of the wafer. The aforementioned process is also referred to as "bath damage etch/critical clean," and, in one embodiment, comprises a wet etch using potassium hydroxide (e.g., two parts potassium hydroxide to water).

Figure 2:
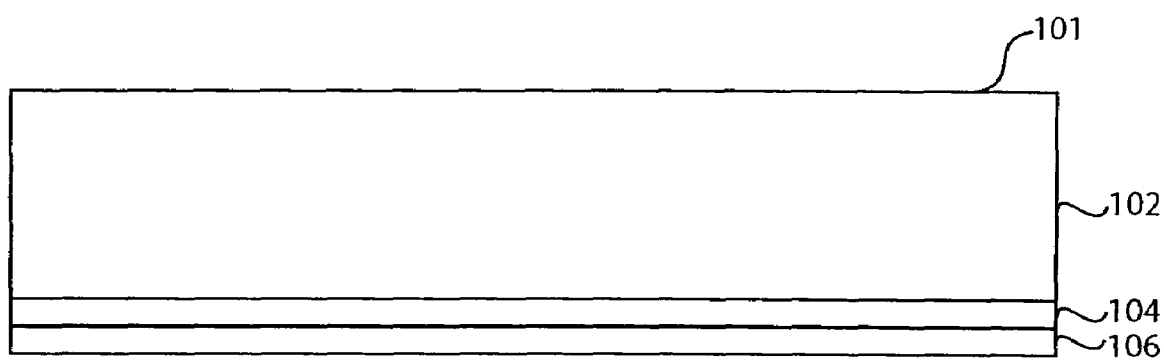

In FIG. 2, a boron-doped silicon dioxide ($SiO_2$) ("BSG") 104 is deposited on the back side of wafer 102. In one embodiment, boron-doped silicon dioxide 104 is deposited to a thickness of about 1000 Angstroms using an atmospheric pressure chemical vapor deposition process (APCVD). The thickness of boron-doped silicon dioxide 104, and other materials disclosed herein, may be varied depending on the application. For example, boron-doped silicon dioxide 104 may also be deposited to a thickness of about 500 Angstroms by APCVD. Thereafter, an undoped silicon dioxide 106 is deposited over boron-doped silicon dioxide 104. In one embodiment, undoped silicon dioxide 106 is deposited to a thickness of about 1200 Angstroms also by APCVD. The use of a deposition process, such as APCVD, to deposit the boron-doped silicon dioxide and the undoped silicon dioxide advantageously allows for one-sided deposition. This is particularly useful in the manufacture of back side contact solar cells where only one side of the solar cell is textured. Note that depending on the application, doped silicon dioxide 104 may also be doped with P-type dopants other than boron.

Figure 3:
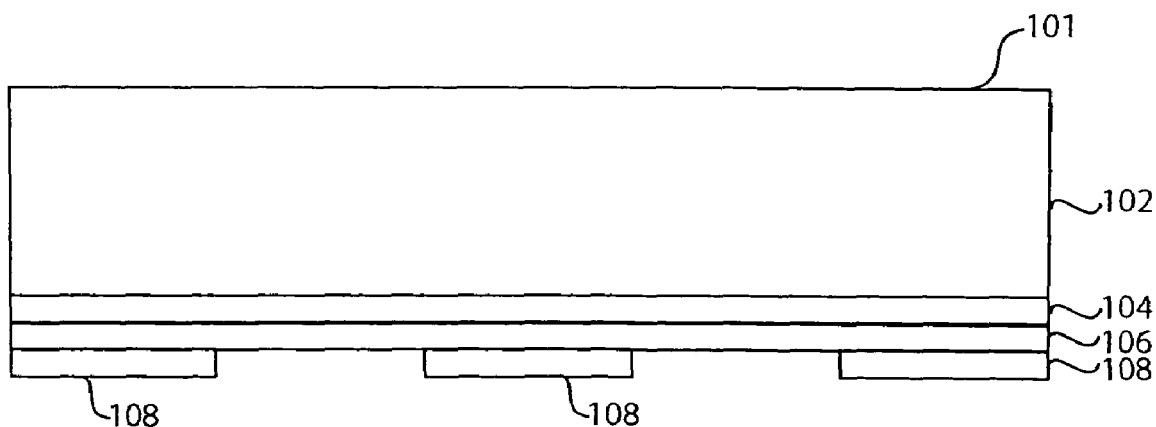

In FIG. 3, a mask 108 is formed over the silicon dioxide stack comprising the boron-doped and undoped silicon dioxide. Mask 108 will be used in a subsequent etch process (see FIG. 4) exposing the would be N+ region of the wafer. Mask 108 may comprise an ink formed by a printing process such as screen printing, pad printing, or ink-jet printing. In one embodiment, the ink comprises a particle-free ink, and may be of the same type as the Coates ER-3070 ink available from Coates Screen of St. Charles, Ill. The particle-free ink may be applied by screen printing. The use of a printing process, such as screen printing, is advantageous in that sufficiently small feature sizes can be achieved with lower process costs.

Figure 4:
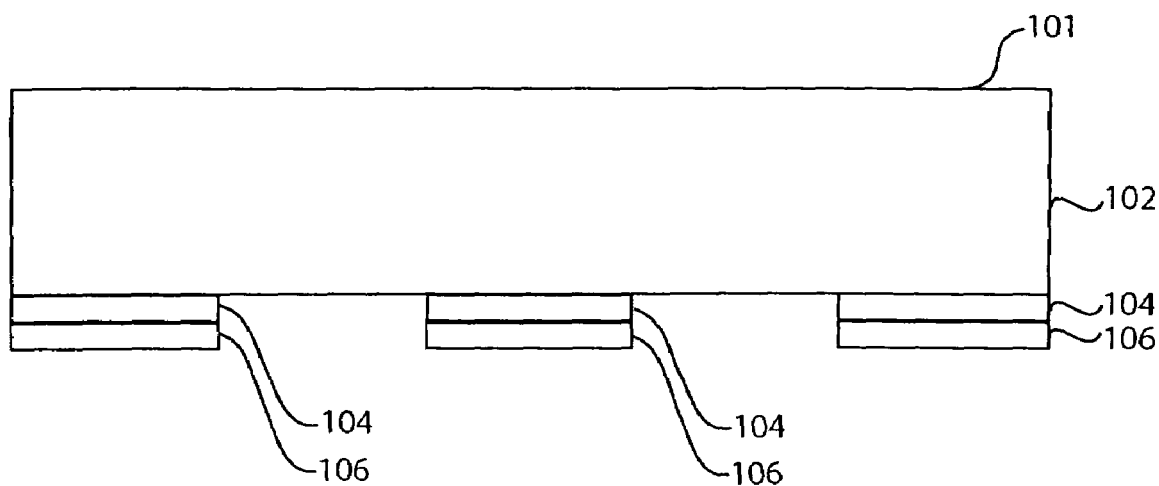

In FIG. 4, mask 108 is employed in patterning the silicon dioxide stack comprising boron-doped silicon dioxide 104 and undoped silicon dioxide 106. In one embodiment, the silicon dioxide stack is patterned using a wet etch process comprising buffered hydrofluoric acid. The wet etch process uses the silicon of wafer 102 as an etch stop, and etches portions of the silicon dioxide stack not covered by mask 108. Mask 108 is thereafter removed.

Figure 5:
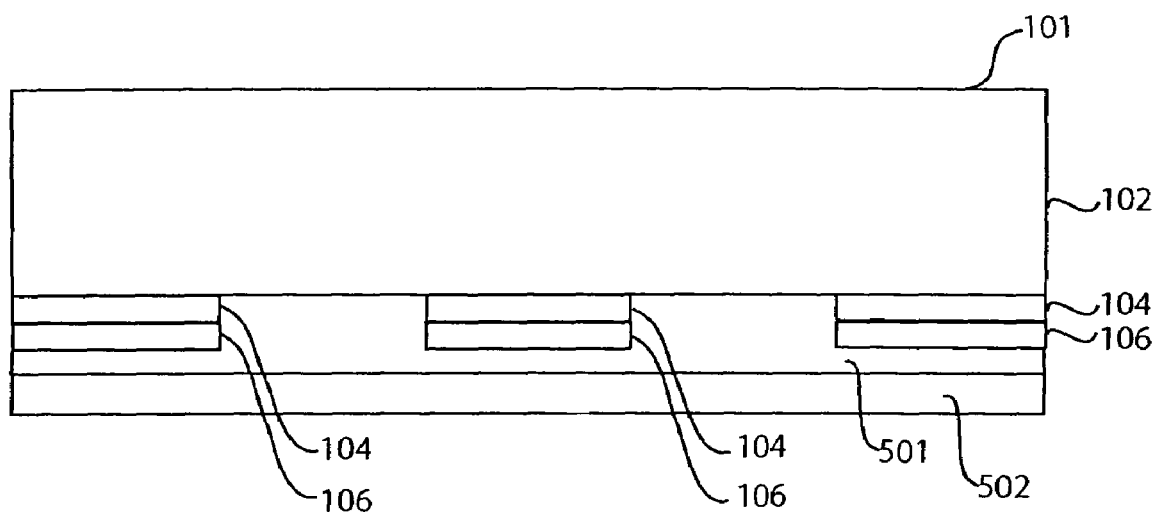

In FIG. 5, a phosphorus-doped silicon dioxide 501 is deposited over the sample of FIG. 4. Thereafter, an undoped silicon dioxide 502 is deposited over phosphorus-doped silicon dioxide 501. In one embodiment, phosphorus-doped silicon dioxide 501 is deposited to a thickness of about 500 Angstroms by APCVD, while undoped silicon dioxide 502 is deposited to a thickness of about 2400 Angstroms also by APCVD. Note that depending on the application, doped silicon dioxide 501 may also be doped with N-type dopants other than phosphorus. Phosphorus-doped silicon dioxide 501 and undoped silicon dioxide 502 are preferably conformal to their respective underlying layers.

Figure 6:
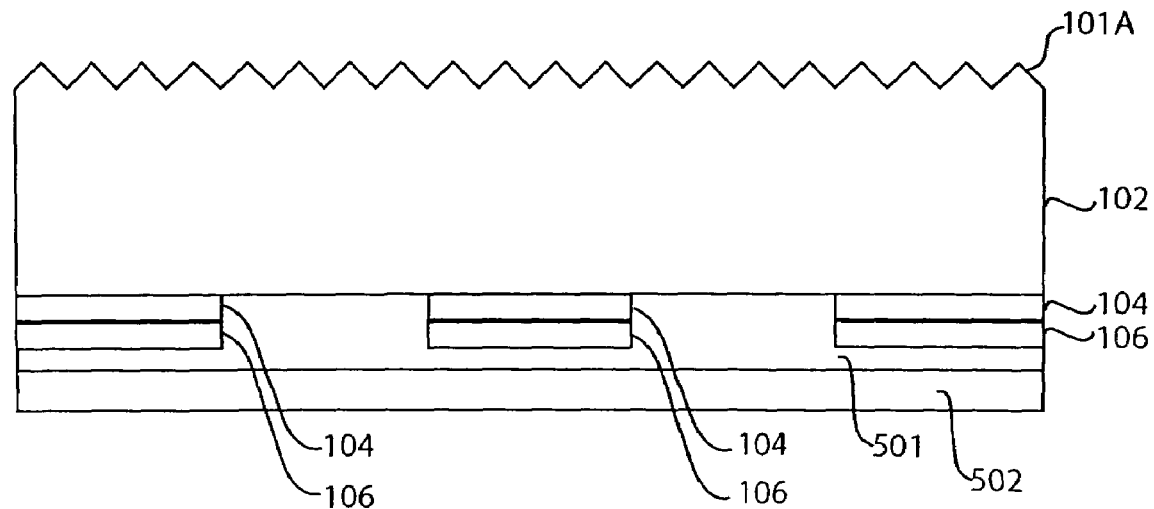

In FIG. 6, front side 101 is textured using a wet etch process comprising potassium hydroxide and isopropyl alcohol. The wet etch textures front side 101 with random pyramids, thereby improving the solar radiation collection efficiency. Undoped oxide 502 advantageously protects the materials on the back side of wafer 102 from the texturing solution. In FIG. 6, front side 101 has been relabeled as "101A" to indicate that it has been textured.

Figure 7:
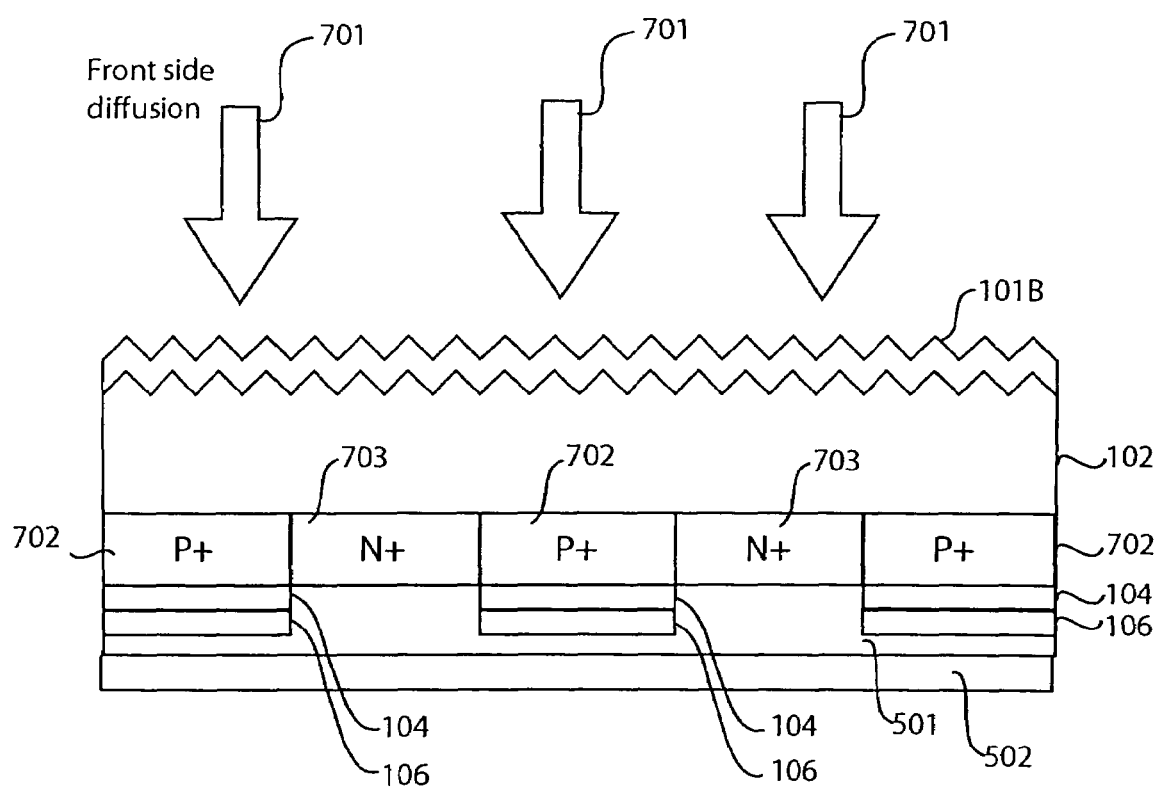

In FIG. 7, the sample of FIG. 6 is subjected to in-situ steps. The steps are in-situ in that they are performed in one loading of wafer 102 into the wafer processing tool. In one embodiment, the in-situ steps are performed in a furnace. In the first in-situ step, wafer 102 is heated to about 1000° C. for one hour to diffuse dopants from boron-doped silicon dioxide 104 and phosphorus-doped silicon dioxide 501 into wafer 102. This results in the formation of P+ regions 702 (due to boron-doped silicon dioxide 104) and N+ regions 703 (due to phosphorus-doped silicon dioxide 501) in wafer 102. Note that during the first in-situ step, undoped silicon dioxide 106 beneficially prevents phosphorus from phosphorus-doped silicon dioxide 501 from diffusing into boron-doped silicon dioxide 104. Also, undoped silicon dioxide 502 beneficially prevents phosphorus from phosphorus-doped silicon dioxide 501 from diffusing into the furnace.

In the second in-situ step, the furnace conditions are changed to about 750° C. with an atmosphere containing phosphorus oxychloride, then to about 975° C. with an atmosphere containing oxygen to diffuse phosphorus as an N-type dopant into wafer 102 from its front side, and to grow a thin layer of silicon dioxide on both sides of wafer 102. Front side 101 is now labeled as "101B" to indicate that there is a thin layer of silicon dioxide on its surface. The thin layer of silicon dioxide advantageously leads to better passivation of the front side and back side surfaces of wafer 102. In FIG. 7, the front side diffusion of N-type dopants into wafer 102 is schematically represented by arrows 701. As can be appreciated the use of in-situ steps to drive dopants into wafer 102 simplifies the fabrication process.

The fabrication of the sample of FIG. 7 may be completed using a back-end process to form electrodes coupled to the P+ and N+ regions of wafer 102 and to include an anti-reflective coating (e.g., silicon nitride) on front side 101B. For example, a back-end process similar to that disclosed in U.S. application Ser. No. 10/412,638 may be employed to complete the fabrication of the sample of FIG. 7. Conventional solar cell back-end processes may also be employed without detracting from the merits of the present invention.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a back side contact solar cell, the method comprising:
    forming a first layer of material over a back side of a substrate;
    forming a second layer of material over the first layer of material, the second layer of material serving as a diffusion barrier;
    diffusing a first dopant from the first layer of material to form a first doped region of a solar cell;
    diffusing a second dopant into the substrate by way of a front side of the substrate; and
    wherein the diffusion of the first dopant and the second dopant are performed in-situ.

2. The method of claim 1 further comprising:
    prior to diffusing the first dopant from the first layer of material:
        patterning the first layer of material and the second layer of material;
        forming a third layer of material on the back side of the substrate;
        forming a fourth layer of material over the third layer of material, the fourth layer of material serving as a barrier layer; and
        diffusing a third dopant from the third layer of material to form a second doped region of the solar cell, wherein the third dopant is diffused in-situ with the first dopant.

3. The method of claim 2 wherein the third layer of material comprises phosphorus-doped silicon dioxide.

4. The method of claim 1 wherein the first layer of material comprises boron-doped silicon dioxide.

5. The method of claim 1 further comprising:
    forming a printed mask over the first layer of material and the second layer of material.

6. The method of claim 5 wherein the mask is formed by screen printing.

7. The method of claim 2 wherein the first dopant comprises a P-type dopant, the second dopant comprises an N-type dopant, and the third dopant comprises an N-type dopant.

8. A method of fabricating a solar cell, the method comprising:
    providing a substrate having a front side and a back side, the front side of the substrate being configured to receive solar radiation for a solar cell;

forming a first doped layer over the back side of the substrate;

diffusing a first dopant from the first doped layer to form a first doped region of the solar cell; and diffusing a second dopant from the front side of the substrate in-situ with the diffusion of the first dopant from the first doped layer.

9. The method of claim 8 further comprising:

forming a second doped layer over the back side of the substrate; and diffusing a third dopant from the second doped layer to form a second doped region of the solar cell, the diffusion of the third dopant from the second doped layer being performed in-situ with the diffusion of the first dopant from the first doped layer.

10. The method of claim 8 further comprising:

forming a first undoped layer over the first doped layer to minimize diffusion of the third dopant from the second doped layer into the first doped layer.

11. The method of claim 10 further comprising:

forming a second undoped layer over the second doped layer to minimize diffusion of the third dopant from the second doped layer into a processing environment where the substrate is heated.

12. The method of claim 8 wherein the first dopant from the first doped layer comprises a P-type dopant and the second dopant diffused from the front side of the substrate comprises an N-type dopant.

* * * * *